United States Patent
Kuhlmann

(10) Patent No.: US 7,332,725 B2
(45) Date of Patent: Feb. 19, 2008

(54) SENSOR ARRANGEMENT FOR RECORDING A RADIATION, COMPUTER TOMOGRAPH COMPRISING SAID SENSOR ARRANGEMENT AND CORRESPONDING PRODUCTION METHOD

(75) Inventor: Werner Kuhlmann, München (DE)

(73) Assignee: Infineon Technologies AG, Munich (DE)

( * ) Notice: Subject to any disclaimer, the term of this patent is extended or adjusted under 35 U.S.C. 154(b) by 207 days.

(21) Appl. No.: 10/525,649

(22) PCT Filed: Aug. 8, 2003

(86) PCT No.: PCT/DE03/02675

§ 371 (c)(1),
(2), (4) Date: Feb. 24, 2005

(87) PCT Pub. No.: WO2004/021456

PCT Pub. Date: Mar. 11, 2004

(65) Prior Publication Data

US 2005/0230631 A1 Oct. 20, 2005

(30) Foreign Application Priority Data

Aug. 28, 2002 (DE) .............................. 102 39 506

(51) Int. Cl.
*G01T 1/24* (2006.01)
(52) U.S. Cl. .............................. 250/370.11; 250/370.14
(58) Field of Classification Search ........... 250/370.08, 250/370.09, 370.11, 366, 367, 338.1, 338.3, 250/370.14
See application file for complete search history.

(56) References Cited

U.S. PATENT DOCUMENTS 4,940,901 A 7/1990 Henry et al.
(Continued)

FOREIGN PATENT DOCUMENTS

DE 3009723 9/1981
(Continued)

OTHER PUBLICATIONS

J.S. Drewery, G. Cho, I. Fujieda, T. Jing, S.N. Kaplan, V. Perez-Mendez and D. Wildermuth, *Amorphous Silicon Pixel Arrays*, Nuclear Instruments and Method in Physics Research A310, pp. 165-170, 1991.

(Continued)

*Primary Examiner*—David Porta
*Assistant Examiner*—Faye Boosalis
(74) *Attorney, Agent, or Firm*—Brinks Hofer Gilson & Lione

(57) ABSTRACT

A sensor arrangement has a layer sequence that includes a holding substrate, an auxiliary layer, a detection layer and an insulating layer. The holding substrate holds detection elements. The auxiliary layer extends continuously over the detection elements or contains separate regions which are associated with a detection element. The detection layer has separate detection regions which are contained in a detection element and contain at least one semiconductor component which is sensitive to radiation. The insulating layer has separate insulating regions for electrically insulating the detection regions from a point of contact having electrically conductive connections and pads fitted on the free side. The pads are electrically connected to connecting points which are routed to the semiconductor components. This sensor arrangement can be used for detecting X-ray radiation and can be manufactured with particular ease.

15 Claims, 7 Drawing Sheets

U.S. PATENT DOCUMENTS

Figure 1:
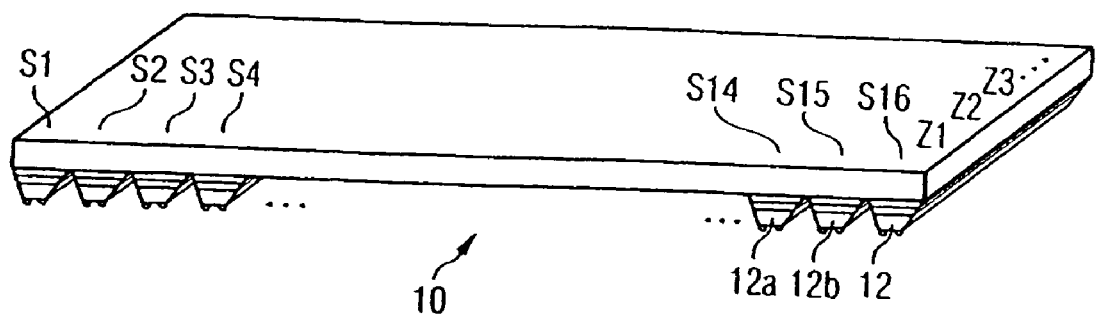

| | | | |
|---|---|---|---|
| 4,982,096 A | | 1/1991 | Fujii et al. |
| 5,122,666 A | * | 6/1992 | Turnbull ................. 250/338.3 |
| 5,545,899 A | * | 8/1996 | Tran et al. ............ 250/370.09 |
| 5,581,084 A | * | 12/1996 | Chapman et al. ........ 250/338.4 |
| 6,072,224 A | * | 6/2000 | Tyson et al. ................ 257/443 |
| 6,252,231 B1 | * | 6/2001 | Harootian ................... 250/368 |
| 6,396,043 B1 | * | 5/2002 | Glenn et al. ............ 250/208.1 |

FOREIGN PATENT DOCUMENTS

| | | |
|---|---|---|
| EP | 0 275 446 | 12/1987 |
| EP | 1 291 676 A2 | 7/2002 |

OTHER PUBLICATIONS

International Examination Report from corresponding PCT application No. PCT/DE2003/002675.

* cited by examiner

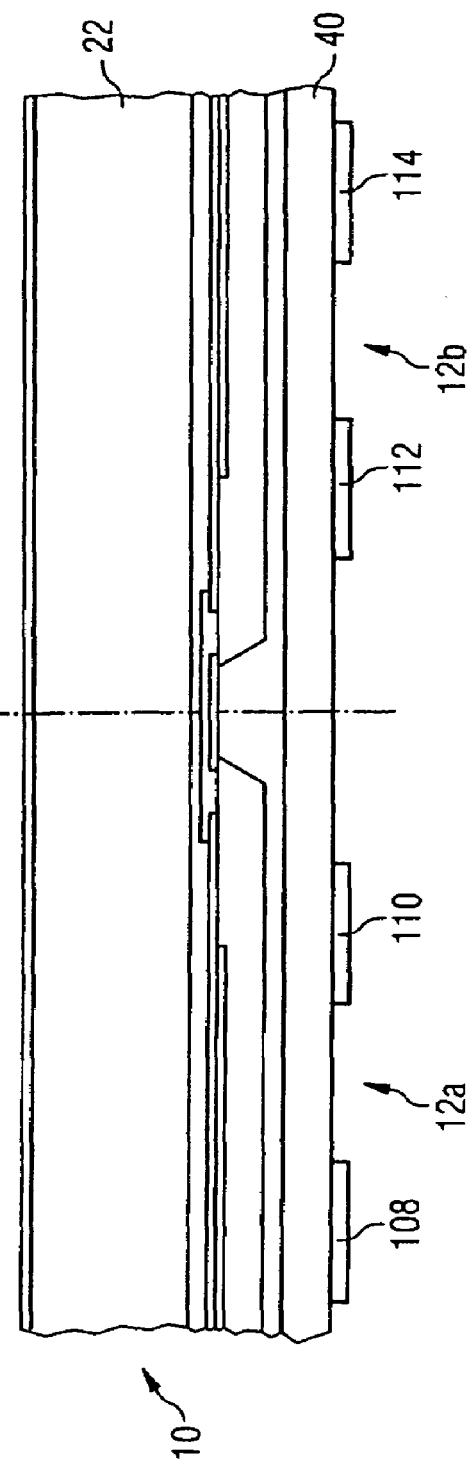
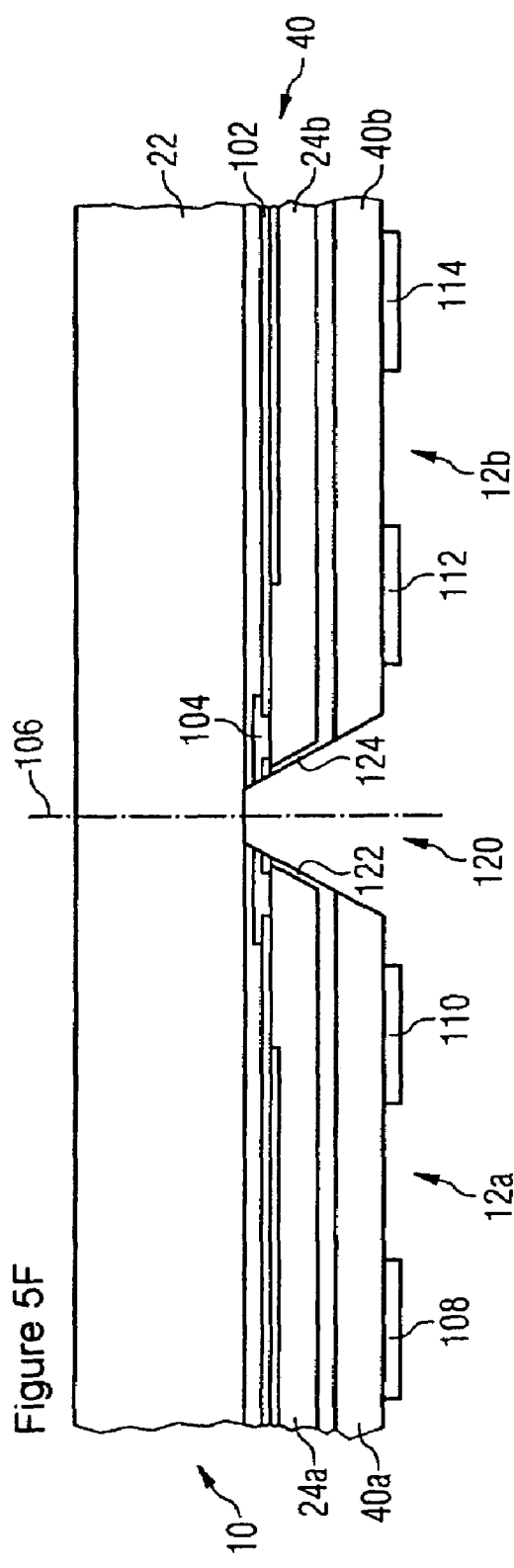

SENSOR ARRANGEMENT FOR RECORDING A RADIATION, COMPUTER TOMOGRAPH COMPRISING SAID SENSOR ARRANGEMENT AND CORRESPONDING PRODUCTION METHOD

This application is the national stage application of international application number PCT/DE2003/002675, filed on Aug. 8, 2003, which claims the benefit of priority to German Patent Application 102 39 506.3, filed on Aug. 28, 2002, incorporated herein by reference.

Sensor arrangement for detecting radiation, computer tomograph having this sensor arrangement, and associated manufacturing method The invention relates to a sensor arrangement for detecting radiation, particularly X-ray radiation. The sensor arrangement contains a large number of detection elements. Such sensor arrangements are used, by way of example, in computer tomographs or devices for irradiating luggage items in the airport sector through to irradiating containers or entire HGVs at border control posts. As radiation-sensitive sensors, the sensor arrangement contains a pin diode, for example.

A pin diode is a diode with a layer sequence p, i and n, where p denotes a highly p-doped region, i denotes an intrinsically conductive or intrinsic or else just weakly n- or p-doped region, and n denotes a highly n-doped region. The pin junction differs from a pn junction particularly by virtue of the intrinsic or weakly doped intermediate region. On account of the fact that the reverse current through the pin diode depends primarily on the charge generation in the i zone, this diode is used as a pin photodiode or as a radiation detector, for example in nuclear technology. In a computer tomograph, the X-ray radiation is converted into radiation which can be detected using the pin diode, for example into visible light, particularly into light in a wavelength range of between five hundred and seven hundred nanometers, for example using a "scintillator layer". Light in this wavelength range can be detected by silicon, for example, with a high degree of effectiveness.

It is an object of the invention to specify, for the purpose of detecting radiation, a sensor arrangement of simple design which can be manufactured using standard semiconductor methods, in particular, which can be manufactured at low cost and which can be manufactured with a high yield. In addition, the intention is to specify a computer tomograph having such a sensor arrangement, and an associated manufacturing method.

The inventive sensor arrangement contains the following in the stated order, for example from top to bottom:

a holding substrate which is permeable to the detectable radiation, at least in regions, or produces detectable radiation when radiation impinges and which holds a plurality of detection elements in the sensor arrangement, at least one auxiliary layer which is permeable to the detectable radiation and extends continuously over a plurality of detection elements or which contains separate regions which are respectively associated with a detection element, a detection layer with separate detection regions which are contained in a detection element and respectively contain at least one semiconductor component which is sensitive to the detectable radiation, and an insulating layer with separate insulating regions for electrically insulating the detection regions from a point of contact having electrically conductive connections.

The invention is based on the consideration that a sensor arrangement having layer sequences can be manufactured with ease. In particular, the manufacturing process can be in a form such that the detection elements never have to be mechanically separated from one another, which would make them significantly more difficult to handle. The holding substrate and the auxiliary layer ensure that the detection elements remain mechanically connected to one another throughout the whole manufacturing process. The auxiliary layer achieves this object up to the application of the holding substrate. Once the holding substrate has been applied, the auxiliary layer can also be separated.

In one refinement, the layers in the layer sequence are in planes which are parallel to one another. This measure allows holding substrates, auxiliary layers, detection layers and insulating layers with planar areas to be used for manufacturing the sensor arrangement.

In one development of the sensor arrangement, the holding substrate contains regions which are permeable to the detectable radiation as part of the detection elements, and between the detection elements detectable, radiation-absorbing regions. This measure ensures that the detectable radiation reaches only one detection element.

In another development, the holding substrate contains a material which converts particle radiation impinging on the material or radiation which is high in energy as compared with the detectable radiation into the detectable radiation. Thus, in particular, X-ray radiation can be converted into radiation which can be detected with a high degree of effectiveness using a semiconductor component. Such materials are also called scintillators. One suitable material is GaO sulfide, for example.

In another development of the sensor arrangement, regions of the auxiliary layer are separated by a filling material. This measure likewise ensures that the radiation impinges only on one detection element. Crosstalk is avoided by means of a suitable choice of filling material. If the filling material also extends between the detection regions and the insulating regions, then the mechanical robustness of the entire sensor arrangement is significantly increased. In a subsequent development, the filling material used is a material having a high degree of reflection, for example titanium dioxide.

In a subsequent development, the auxiliary layer is a glass layer. Alternatively or in addition, the insulating layer is also a glass layer. The use of glass allows the manufacturing process to be carried out with ease, because glass is a material which has similar material properties to the materials used in semiconductor technology. In particular, the thermal coefficient of expansion can be matched to that of silicon or of other semiconductors.

In a subsequent development, the detection layer contains a semiconductor support material, for example a silicon material. By way of example, the semiconductor support material is a thinned silicon plate, i.e. a "wafer".

In a subsequent development, the contact point contains solder material. Hence, to bring the sensor arrangement into contact with an integrated circuit containing a selected circuit, a "board quick-fitting technique" can be used, which is also called flip-chip technology. Other ways of making contact can also be used, however.

In a subsequent development, the detection area of the detection elements is respectively smaller than five square millimeters or smaller than one square millimeter. This measure increases the resolution of the imaging systems considerably as compared with previously customary resolutions. In this context, resolution is understood to mean the number of pixels in relation to a particular reference unit. The reference unit normally used internationally is one inch (25.4 millimeters). In one refinement, the sensor arrangement contains more than two hundred detection elements, for example for more than five hundred.

In another development, a radiation-sensitive semiconductor component of a pin diode is used in each sensor element. The diode contains a pin layer sequence. The connections of the diode are routed, as one alternative, just to one side of a support substrate. However, use is also made of pin diodes which have connections on both sides of the support substrate.

In line with another aspect of the invention, a computer tomograph is specified which contains the inventive sensor arrangement or one of its developments. The use of the sensor arrangement in a computer tomograph for examining human or animal tissue allows a significant improvement in the performance of the computer tomograph, particularly in respect of the resolution.

The invention also relates to a method for manufacturing a sensor arrangement in which the following steps are performed without any limitation by the order indicated:

a large number of integrated radiation-sensitive semiconductor components are manufactured starting from a support substrate made of semiconductor material of an initial thickness, the support substrate and an auxiliary substrate are mechanically connected on one side of the support substrate, which side contains radiation-sensitive areas of the semiconductor components, the support substrate is thinned on the bare side to a thickness which is less than the initial thickness, the free side of the support substrate is mechanically connected to an insulating substrate, pads are put on the free side of the insulating substrate, the insulating substrate is separated at the boundaries between individual semiconductor boards having a large number of semiconductor components and/or at the boundaries between individual semiconductor components, with the auxiliary substrate not being separated, the pads are electrically connected to connecting points which lead to the semiconductor components, the auxiliary substrate and a holding substrate are mechanically connected on the bare side of the auxiliary substrate, the auxiliary substrate is separated at the boundaries between individual semiconductor boards and/or individual semiconductor components, with the auxiliary substrate not being separated.

In one refinement, the inventive method allows the manufacture of X-ray sensor arrangements containing pin diodes using a manufacturing method which is considerably simpler than previous manufacturing methods.

Figure 2:
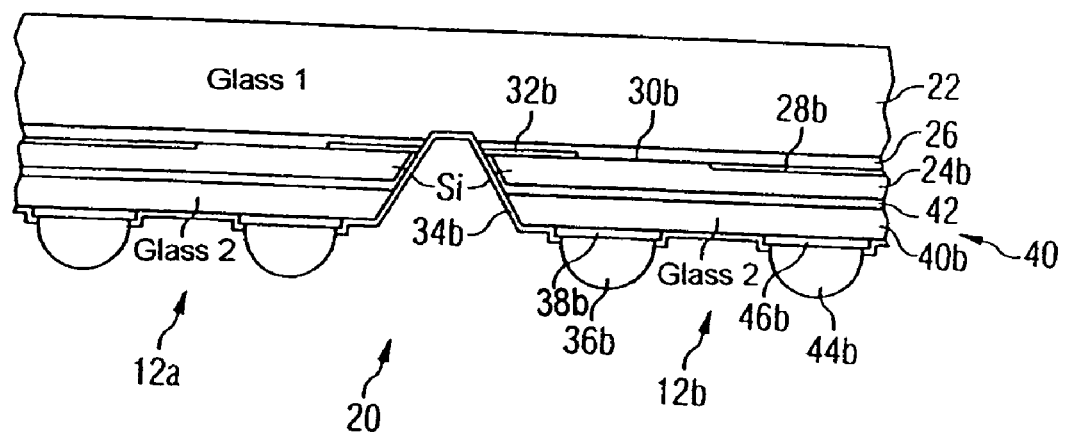
Figure 3:
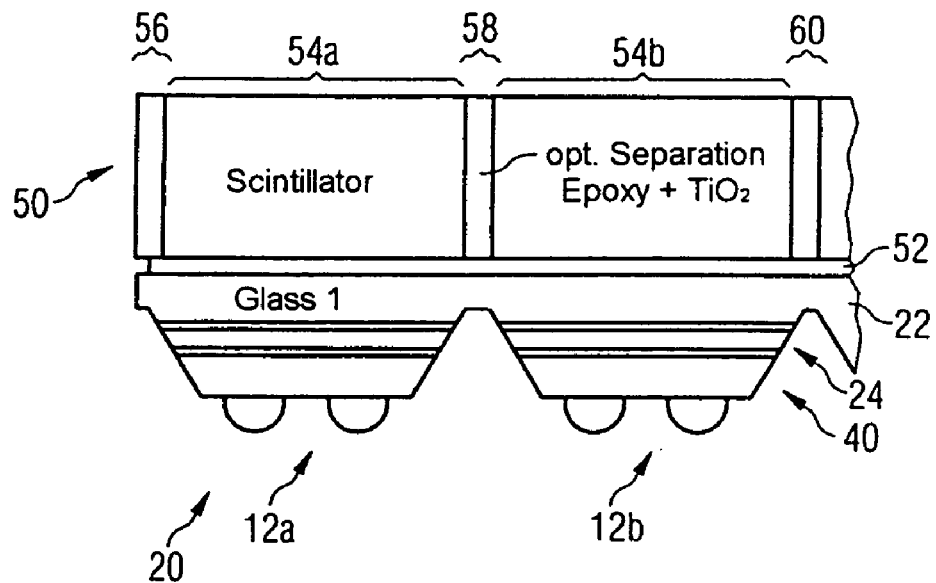
Figure 4:
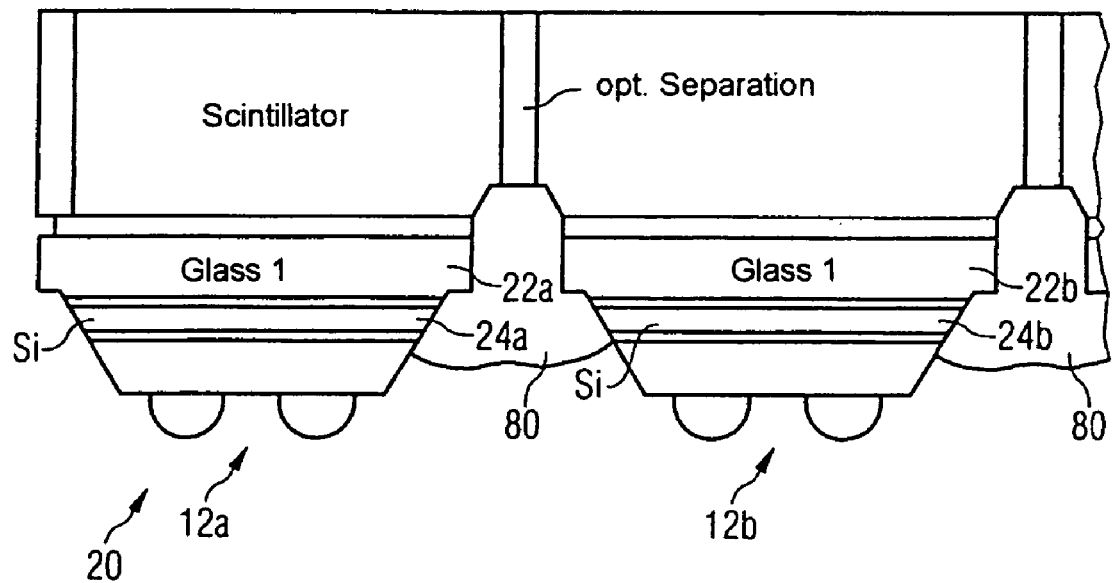

Exemplary embodiments of the invention are explained below with reference to the appended drawings, in which:

FIG. 1 shows a sensor chip containing two hundred and fifty-six sensor elements, FIG. 2 shows an enlarged illustration of a detail of the sensor chip, FIG. 3 shows the sensor chip with a scintillator block, FIG. 4 shows the sensor chip at the end of the manufacturing method, and FIGS. 5A to 5I show selected manufacturing stages for the sensor chip.

FIG. 1 shows a basic illustration of a sensor chip 10 containing two hundred and fifty-six sensor elements 12, 12a, 12b which are all of the same design but can differ in their lateral dimensions. The sensor elements 12, 12a, 12b are arranged in matrix form in sixteen rows Z1 to Z16 and sixteen columns S1 to S16.

FIG. 2 shows an enlarged illustration of a detail 20 of the sensor chip 10 with two sensor elements 12a and 12b. The sensor elements 12a and 12b are held by a glass plate 22. The design of a sensor element is explained below with reference to the sensor element 12b.

In a wafer layer 24, the sensor element 12b contains a wafer region 24b which is bonded on the glass plate 22 using an adhesive layer 26, e.g. comprising epoxy resin. The wafer region 24b contains silicon and doped regions of a pin diode 28b. An interconnect 30b extends from a connection for the diode 28b to a pad 32b at the edge of the wafer region 24b. An outer interconnect 34b produces an electrically conductive connection between the pad 32b and a solder pellet 36b on a contact area 38b.

That side of the wafer region 24b which is remote from the glass plate 28 has a glass plate region 40 which is bonded on the wafer region 24b using an adhesive layer 42.

Apart from the solder pellet 36b, the sensor element 12b contains another solder pellet 44b comprising a soft solder on a contact area 46b. There are thus two connections for the sensor element 12b, for example for a ground connection and for a signal connection.

In the exemplary embodiment, the sensor element 12b and also the other sensor elements 12, 12a contain no further semiconductor components, particularly no amplifying components, besides the pin diode.

Method steps for manufacturing the sensor chip 10 shown in FIGS. 1 and 2 are explained in more detail below with reference to FIGS. 5E to 5I. In line with the first exemplary embodiment explained, the sensor chips 10 on a wafer are separated before a "scintillator block" is mounted on the sensor chip.

FIG. 3 shows the detail 20 of the sensor chip 10 with a scintillator block 50 which is bonded on the free side of the glass plate 22 using an adhesive layer 52. The adhesive layer 52 is an epoxy resin layer, for example.

In the exemplary embodiment, the scintillator block 50 contains regions 54a and 54b which convert X-ray radiation into visible light and which are respectively associated with a sensor element 12a or 12b. Between the regions 54a, 54b, there are reflective regions 56 to 60 which reflect visible light into the regions 54a, 54b in order to increase the sensitivity of the sensor.

When the scintillator block 50 has been bonded onto the glass plate 22, the glass plate 22 still continues between adjacent sensor elements 12a and 12b on a sensor chip 10.

FIG. 4 shows the detail 20 after sawing through the glass plate 22 in regions between the sensor elements 12a and 12b. Sawing has turned the glass plate 22 into two glass plate regions 22a and 22b which are associated with the sensor element 12a or 12b. During the sawing, the scintillator block 50 has been only partially sawed, but not severed.

Following sawing, the regions between the glass plate regions 22a and 22b and between the wafer regions 24a and 24b have been filled with a filling material 80, for example with an epoxy resin, which has been mixed with titanium dioxide.

Figure 5A:
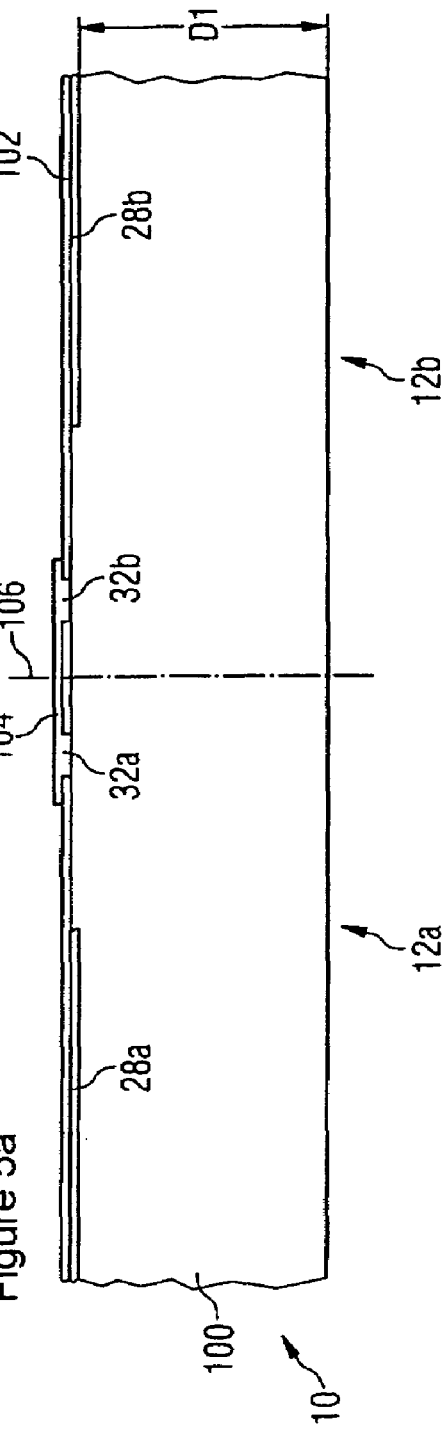

FIG. 5A shows a manufacturing stage to the sensor chip 10 after manufacture of the pin diodes 28a, 28b on a semiconductor wafer 100 which has a thickness D1 of 650 or 750 microns, for example. Following manufacture of the pin diodes 28a, 28b, a passivation layer 102 has been applied over the entire area, for example a silicon nitrite layer. For pads 32a and 32b, a photolithographic method has then been used to produce cutouts in the passivation layer 102.

Subsequently, a metallization layer 104 is applied and structured. This has resulted in electrically conductive connections between the filled cutouts and edge regions of the sensor elements 12a, 12b.

In FIGS. 5A to 5I, a dash-dot line illustrates a boundary 106 between the sensor elements 12a and 12b.

Figure 5B:
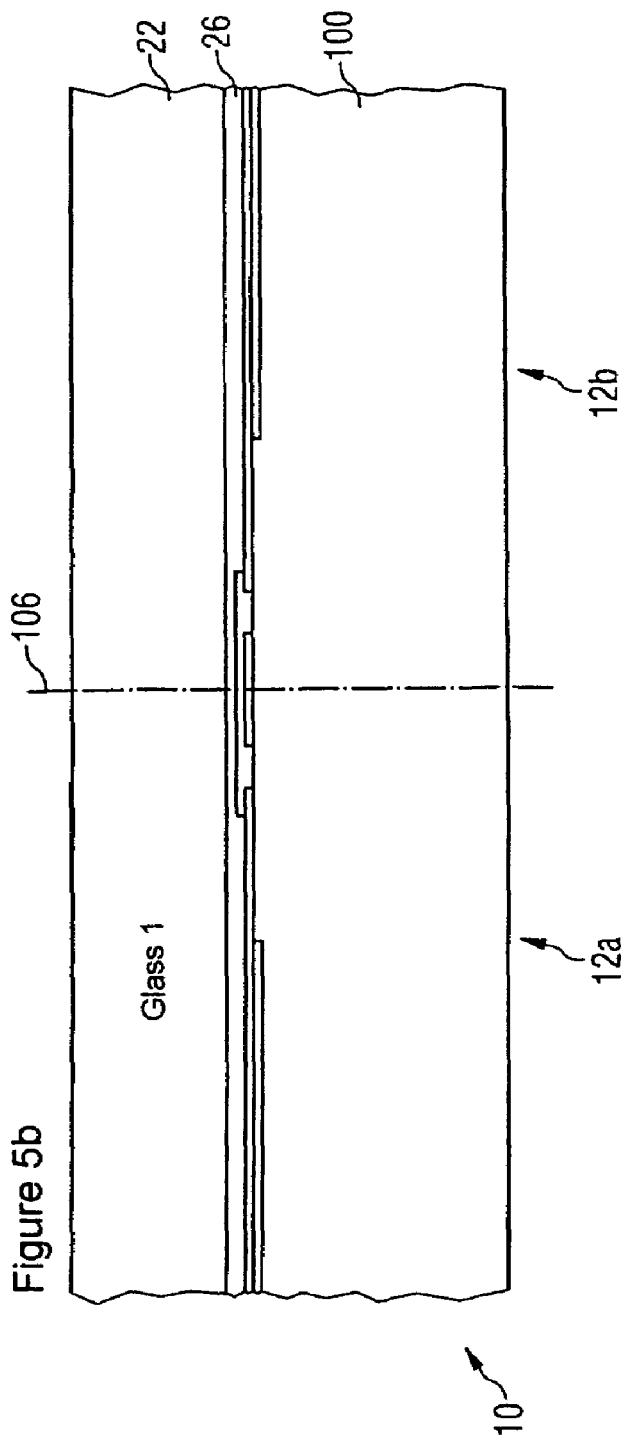

As FIG. 5B shows, the glass plate 22 has then been bonded on. In the exemplary embodiment, the glass plate 22 has a thickness of 400 microns, for example, which means that it is comparatively robust in mechanical terms.

Figure 5C:
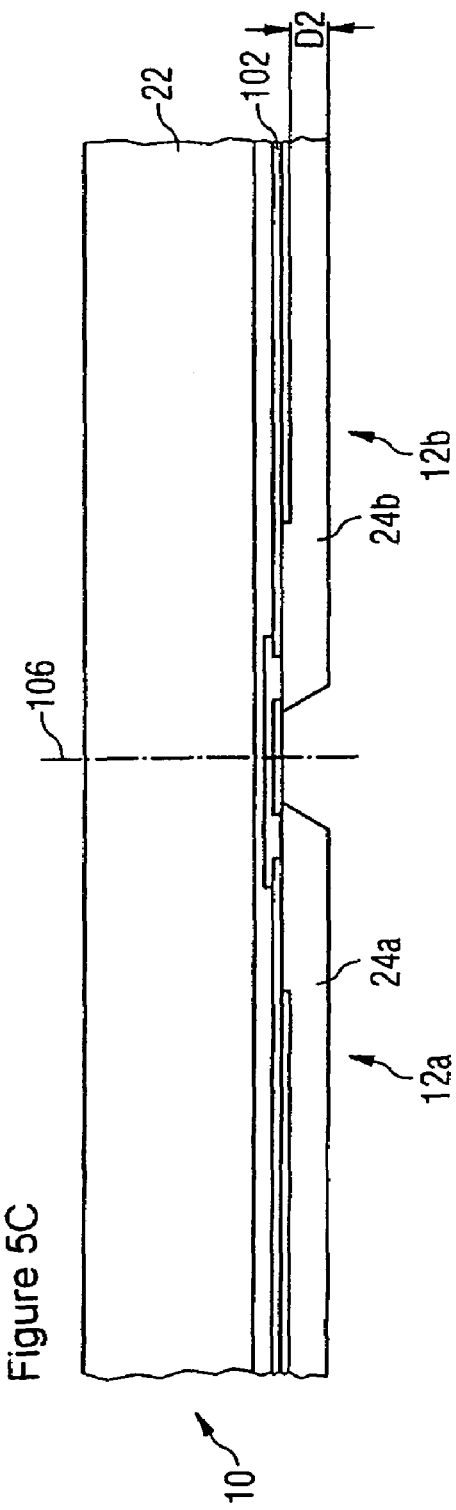

FIG. 5C shows the sensor chip 10 after a grinding-thin process or an etching process, in which the thickness D1 of the semiconductor wafer 100 has been reduced by at least half the thickness D1 to a thickness D2, which is fifty microns in the exemplary embodiment. Following thinning, the individual chips 10 and also the individual wafer regions 24a, 24b are separated using an etching process, for example using a wet chemical etching process. Etching is performed selectively with respect to the passivation layer 102, for example.

Figure 5D:
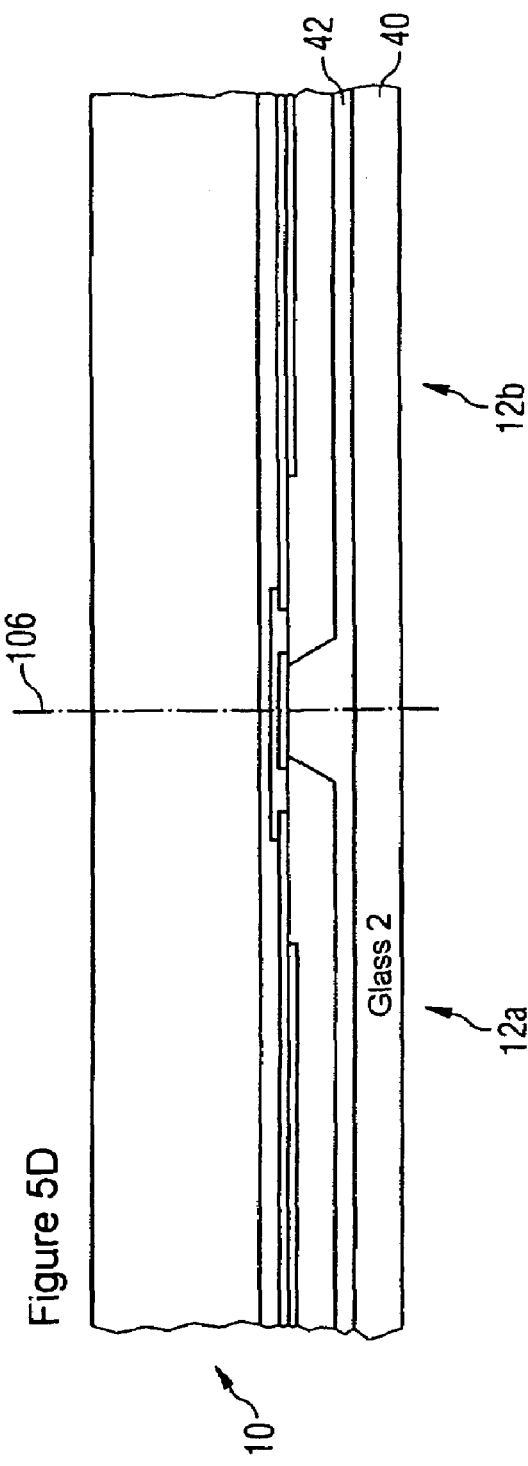

FIG. 5D shows the sensor chip 10 after the glass plate 40 has been bonded using the adhesive layer 42. As already mentioned, the adhesive layer 40 likewise comprises epoxy resin or another suitable adhesive.

FIG. 5E shows the sensor chip 10 after solder pads 108 to 114 have been applied to the glass plate 40, for example the solder pads 112 and 114 bear the contact areas 38b and 46b.

As FIG. 5F shows, the glass plate 40 is then sawn up, using a V-shaped cut 120, at the boundary 106, with the glass plate regions 40a and 40b being produced on the glass plate 40. The cut 120 extends into the glass plate 22 and thus severs both the passivation layer 102 and the metallization layer 104 in the region of the boundary 106. Between the wafer regions 24a and 24b and between the lateral faces of the cut 120, there remain regions 122 and 124 which are filled with epoxy resin and which simplify the production of a conductive connection to the solder pads 108, 110 and 112, 114, inter alia.

Figure 5G:
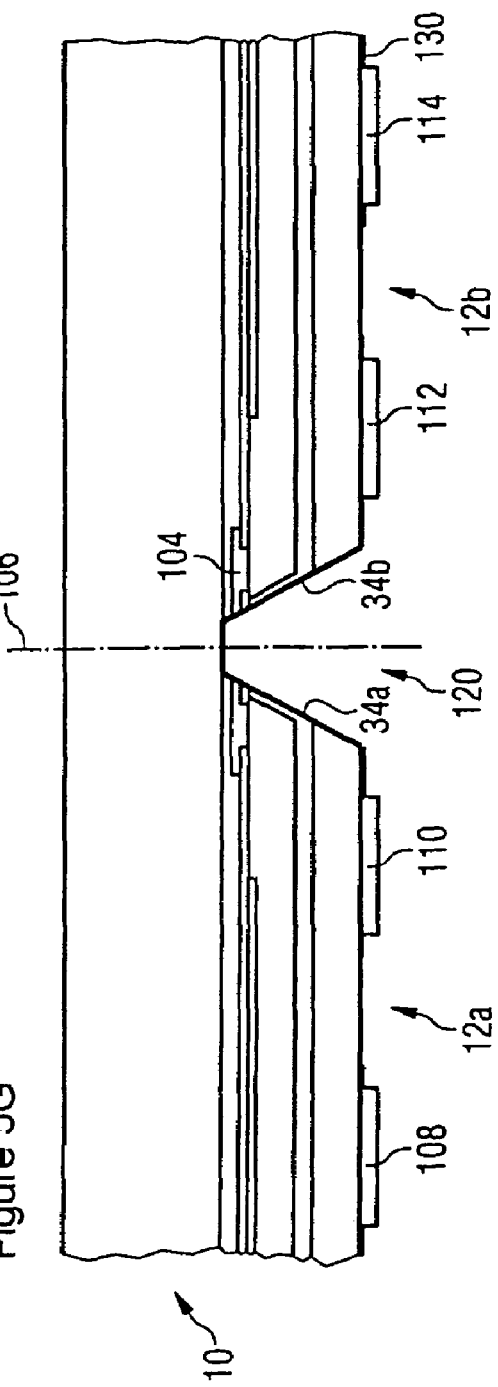

As FIG. 5G shows, a metallization layer 130 is then applied to the rear of the sensor chip 10 and is structured, thus producing the outer interconnects 34a and 34b. Sections of the outer interconnects 34a and 34b run against the side walls of the cut 120, so that contact is also made with interconnects in the metallization layer 104 which extend as far as the cut 120.

Figure 5H:
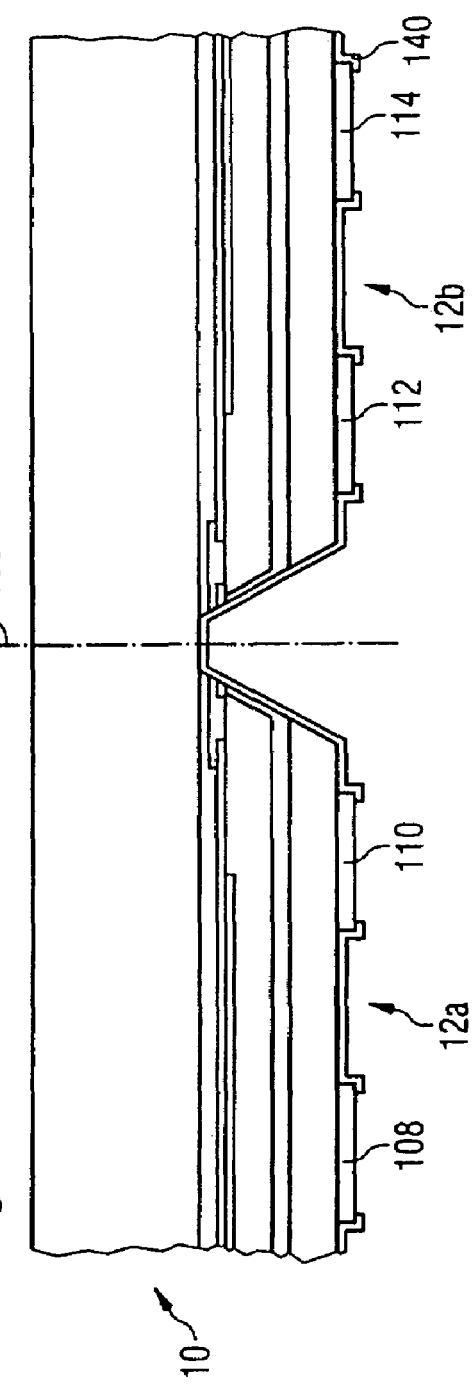

FIG. 5H shows a process stage in the manufacture of the sensor chip 10 following application of a passivation layer 140 to the rear of the sensor chip 10. In a subsequent method step, the passivation layer 140 is structured in the region of the solder pads 108 to 114, so that the solder pads 108 to 114 are exposed.

Figure 5I:
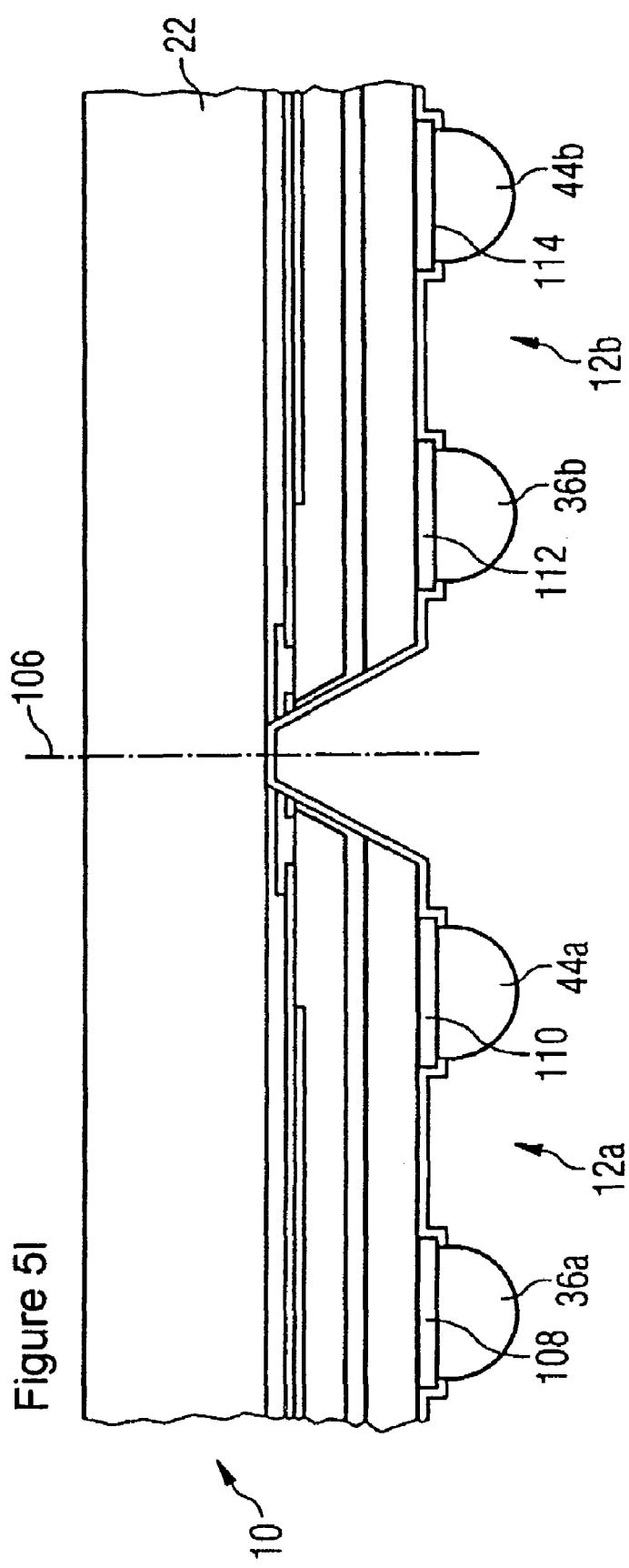

As FIG. 5I shows, the solder pellets 36a, 44a, 36b and 44b are then applied to the solder pads 108 to 114, with the passivation layer 140 acting as a mask.

After the manufacturing stage shown in FIG. 5I, the first exemplary embodiment involves the sensor chips 10 being separated and only then being connected to the scintillator blocks 50, see the explanations relating to FIGS. 3 and 4. During separation of the sensor chips 10, the glass plate 22 is separated at the chip boundaries, but not between the sensor elements 12a, 12b of a sensor element 10.

In another exemplary embodiment, the scintillator blocks 50 are bonded onto the glass plate 22 before the chips are separated. The glass plate 22 is then separated between the sensor elements 12a, 12b of a sensor chip 10, during which process the scintillator blocks 50 are not yet severed. Only in a subsequent method step are both the glass plate 22 and the scintillator blocks 50 then separated at the chip boundaries.

In a subsequent exemplary embodiment, there is a departure from the sequence of method steps illustrated in FIGS. 5A to 5I. By way of example, the cut 120 can be made before the solder pads 108 to 114 are applied. The cut 120 can also be made deeper or wider than explained, which means that the adhesive material is also removed in the regions 122, 124.

If the sensor elements each contain just one pin diode, then there are no technology differences such as arise when integrating amplifier elements in the sensor chip. This significantly reduces the process costs for each area section with photodiodes.

The arrangement of the connections on the rear results in a smaller chip area in the lateral direction. In addition, there is sufficient space for the connections on the rear, which means that the dimensions of the connections can be chosen more generously. Arranging the connections on the rear also allows the scintillator block to be fitted more easily.

The formation of wafer regions also prevents crosstalk between the semiconductor components of different sensor elements.

The arrangement explained allows the full length of a sensor element to be used for the metal connection between the top of the wafer regions and the solder pellets.

In another exemplary embodiment, more than two connections per sensor element are produced.

The invention claimed is:

1. A sensor arrangements for detecting radiation having a layer sequence which contains, in the order indicated:
   a holding substrates which is permeable to the detectable radiation, at least in regions, or produces the detectable radiation when radiation impinges thereon and which holds a plurality of detection elements in the sensor arrangement,
   at least one auxiliary layers which is permeable to the detectable radiation and extends continuously over a set of the plurality of detection elements or which contains separate regions which are respectively associated with a detection element,
   a detection layers with separate detection regions which are contained in a detection element and respectively contain at least one semiconductor component which is sensitive to the detectable radiation,
   an insulating layer with separate insulating regions for electrically insulating the detection regions from a point of contact having electrically conductive connections and pads fitted on a free side, the pads being electrically connected to connecting points which are routed to the semiconductor components, and
   wherein the holding substrate contains at least one of: a material which converts impinging particle radiation or radiation which is high in energy as compared with the detectable radiation into the detectable radiation, and a material which converts X ray radiation into radiation which can be detected with a pin diode.

2. The sensor arrangement as claimed in claim 1, wherein the holding substrate contains regions which are permeable to the detectable radiation and are respectively contained in a detection element, and the holding substrate contains, between the detection elements, regions which absorb or reflect the detectable radiation.

3. The sensor arrangement as claimed in claim 1, wherein at least one of: at least one of the regions of the auxiliary layers, the detection regions, and the insulating regions are separated by a filling material, the filling material is a plastic, and the filling material has been mixed with a material which absorbs or reflects the detectable radiation.

4. The sensor arrangement as claimed in claim 1, wherein at least one of: the auxiliary layer is a glass layer or a ceramic layer, the insulating layer is a glass layer, the detection layer contains a semiconductor support material, and the point of contact contains solder material.

5. The sensor arrangement as claimed in claim 1, wherein at least one of: a detection area on the detection elements is smaller than five square millimeters, and the sensor arrangements contain more than two hundred detection elements.

6. The sensor arrangement as claimed in claim 1, wherein each of the semiconductor components contains a doped region of one conduction type, a doped region of another conduction type and, between these doped regions, an intermediate region which is undoped or is provided with a weak doping as compared with the doping of the other doped regions.

7. The sensor arrangement as claimed in claim 1, wherein the holding substrate contains at least one of a highly absorbent semiconductor material, CdZnTe, PbO, and GaO sulfide.

8. The sensor arrangement as claimed in claim 1, wherein the detection layer contains silicon.

9. A computer tomograph comprising:
a radiation transmission unit for emitting radiation;
a detection unit for detecting the emitted radiation following passage of the emitted radiation through a tissue which influences a radiation intensity; and
an evaluation unit which receives output signals from the detection unit as the basis for producing image data for an image of a structure of the tissue,
wherein the detection unit contains a sensor arrangement, the sensor arrangement comprising in the order indicated:
a holding substrate which is permeable to the emitted radiation, at least in regions, or produces detectable radiation when the emitted radiation impinges thereon and which holds a plurality of detection elements in the sensor arrangement,
at least one auxiliary layer which is permeable to the emitted or detectable radiation and extends continuously over a set of the plurality of detection elements or which contains separate regions which are respectively associated with a detection element,
a detection layer with separate detection regions which are contained in a detection element and respectively contain at least one semiconductor component which is sensitive to the emitted or detectable radiation,
an insulating layer with separate insulating regions for electrically insulating the detection regions from a point of contact having electrically conductive connections and pads fitted on a free side, the pads being electrically connected to connecting points which are routed to the semiconductor components, and
wherein the emitted radiation is X ray radiation.

10. A method for manufacturing a sensor arrangement, the method comprising performing without any limitation by the order indicated:
manufacturing a large number of integrated radiation-sensitive semiconductor components starting from a support substrate made of semiconductor material of an initial thickness,
mechanically connecting the support substrate and an auxiliary substrate on one side of the support substrate, the one side containing radiation-sensitive areas of the semiconductor components,
thinning the support substrate on a bare side to a thickness which is less than the initial thicknesses,
mechanically connecting a free side of the support substrate to an insulating substrate,
disposing pads a free side of the insulating substrate,
separating the insulating substrate is at least one of: at boundaries between individual semiconductor boards having a large number of semiconductor components and at boundaries between the individual semiconductor components, with the auxiliary substrate not being separated,
electrically connecting the pads to connecting points which lead to the semiconductor components,
mechanically connecting the auxiliary substrate and a holding substrate on a bare side of the auxiliary substrate, with the holding substrate containing at least one of: a material which converts impinging particle radiation or radiation which is high in energy as compared with the detectable radiation into the detectable radiation, and a material which converts X ray radiation into radiation which can be detected with a pin diode, and
separating the auxiliary substrate at at least one of: the boundaries between the individual semiconductor boards and individual semiconductor components, with the auxiliary substrate not being separated between the individual semiconductor boards and individual semiconductor components.

11. The method as claimed in claim 10, further comprising separating the thinned support substrate at at least one of: the boundaries between the individual semiconductor boards and the boundaries between the individual semiconductor components, with the auxiliary substrate not being separated and with at least one interconnect in a metallization layer of the semiconductor components being exposed at a connecting point.

12. The method as claimed in claim 10, further comprising filling a cut at a boundary between semi-conductor components with a filling material.

13. The sensor arrangement as claimed in claim 12, wherein the filling material is an epoxy resin.

14. The sensor arrangement as claimed in claim 12, wherein the filling material is mixed with titanium dioxide.

15. The method as claimed in claim 10, wherein the thinned support substrate is separated before the free side of the support substrate is mechanically connected to the insulating substrate.

* * * * *